US005491347A

United States Patent [19]

Allen et al.

[11] Patent Number: 5,491,347

[45] Date of Patent: Feb. 13, 1996

[54] THIN-FILM STRUCTURE WITH DENSE ARRAY OF BINARY CONTROL UNITS FOR PRESENTING IMAGES

[75] Inventors: Robert R. Allen, deceased, late of San Francisco, by Jason Huynh, executor; Richard H. Bruce, Los Altos; Tzu-Chin Chuang, Saratoga; Thomas G. Fiske, Campbell; Ronald T. Fulks; Michael Hack, both of Mountain View; Jackson H. Ho, Palo Alto; Alan G. Lewis, Sunnyvale; Russel A. Martin, Menlo Park, all of Calif.; Louis D. Silverstein, Scottsdale, Ariz.; Hugo L. Steemers, Palo Alto, Calif.; Susan M. Stuber, Redwood City, Calif.; Malcolm J. Thompson, Palo Alto, Calif.; William D. Turner, San Marino, Calif.; William W. Yao, Los Altos, Calif.

[73] Assignee: Xerox Corporation, Stamford, Conn.

[21] Appl. No.: 235,011

[22] Filed: Apr. 28, 1994

[51] Int. Cl.[6] .................................................... H01L 33/00

[52] U.S. Cl. ................................ 257/59; 257/72; 257/88; 257/89; 359/54; 359/55; 359/57; 359/58; 359/59

[58] Field of Search ................................ 257/59, 72, 88, 257/89; 359/57, 58, 59, 54, 55

[56] References Cited

U.S. PATENT DOCUMENTS

| | | | |
|---|---|---|---|
| 4,968,119 | 11/1990 | Stewart | 350/333 |
| 5,126,865 | 6/1992 | Sarma | 359/59 |
| 5,159,476 | 10/1992 | Hayashi | 359/54 |
| 5,182,620 | 1/1993 | Shimada et al. | 257/72 |
| 5,247,289 | 9/1993 | Matsueda | 345/98 |
| 5,295,008 | 3/1994 | Mizobata et al. | 359/58 |
| 5,305,130 | 4/1994 | Yamawaki | 359/88 |

OTHER PUBLICATIONS

Kaneko, E., *Liquid Crystal TV Displays: Principles and Applications of Liquid Crystal Displays,* Tokyo, KTK Scientific, 1987, pp. 211–277.

Sarma, K. R., McCartney, R. I., Heinze, B., Aoki, S., Ugai, Y., Sunata, T., and Inada, T., "A Wide–Viewing–Angle 5–in.–Diagonal AMLCD Using Halftone Grayscale," *SID 91 Digest,* 1991, pp. 555–557.

Bond, J., and Levenson, M. D., "The US gears up to challenge Japan in flat panel displays," *Solid State Technology,* Dec. 1993, pp. 37, 38, and 40–43.

Ruelberg, K. D., and Zander, S., "Colour triple arrangement of liquid crystal displays (LCD)," *Displays,* vol. 14, No. 3, 1993, pp. 166–173.

Martin, R., Chuang, T.–C., Steemers, H., Allen, R., Fulks, R., Stuber, S., and Tilton, M., "'The Liquid Crystal Laser Print', a 6.3 Million Pixel Monochrome AMLCD", 1993.

(List continued on next page.)

*Primary Examiner*—William Mintel

[57] ABSTRACT

A thin-film structure on an insulating substrate includes an array of binary control units with an area of at least 90 $cm^2$ and a density of at least 60 binary control units per cm. One implementation has an area of approximately 510 $cm^2$, a diagonal of approximately 33 cm, and a total of approximately 6.3 million binary control units. Each binary control unit has a lead for receiving a unit drive signal, to which it responds by causing presentation of a segment of images presented by the array. Each binary control unit can present a segment with either a first color having a maximum intensity or a second color having a minimum intensity. Each binary control unit's unit drive signal causes the binary control unit to present its first and second colors. The substrate can be glass. Each binary control unit can include an amorphous silicon thin-film transistor (TFT) and a storage capacitor. Each binary control unit can be square. The thin-film structure can be used in an active matrix liquid crystal display (AMLCD), monochrome or, with an appropriate filter, color.

19 Claims, 11 Drawing Sheets

OTHER PUBLICATIONS

Martin, R., Middo, K., Turner, W., Lewis, A., Thompson, M., and Silverstein, L., "A High Resolution AMLCD for the Electronic Library System.", *Proceedings of the SPIE,* vol. 2219, SPIE Cockpit Displays Conference, Apr. 7 and 8, 1994, pp. 89–96.

Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., and Silverstein, L. D., "P–70: A 6.3–Mpixel AMLCD," *SID 93 Digest,* 1993, pp. 704–707.

Maeda, H., Fujii, K., Yamagishi, N., Fujita, H., Ishihara, S., Adachi, K., and Takeda, E., "A 15–in. Diagonal Full–Color High–Resolution TFT–LCD," *SID 92 Digest,* 1992, pp. 47–50.

Tanaka, Y., Shibusawa, M., Dohjo, M., Tomita, O., Uchikoga, S., and Yamanaka, H., "A 13.8–in.–Diagonal High–Resolution Multicolor TFT–LCD for Workstations," *SID 92 Digest,* 1992, pp. 43–46.

Wu, I–W., Lewis, A. L., Huang, T–Y., Chiang, A., "Performance of Polysilicon TFT Digita Circuits Fabricated with Various Processing Techniques and Device Architectures," *SID 90 Digest,* 1990, pp. 307–310.

THIN-FILM STRUCTURE WITH DENSE ARRAY OF BINARY CONTROL UNITS FOR PRESENTING IMAGES

BACKGROUND OF THE INVENTION

The present invention relates to display techniques.

Maeda, H., Fujii, K., Yamagishi, N., Fujita, H., Ishihara, S., Adachi, K., and Takeda, E., "A 15-in.-Diagonal Full-Color High-Resolution TFT-LCD," *SID* 92 *Digest*, 1992, pp. 47–50, describe an amorphous silicon (a-Si) TFT-LCD with 1152×900 color pixels. The panel uses storage capacitances formed on gate-lines. The technique employs an inverse-staggered a-Si TFT with a double-layered gate insulation layer of tantalum oxide and silicon nitride layers. FIG. 1 shows a cross section view of an a-Si TFT. The technique also employs a capacitively coupled driving method that produces lower offset voltage applicable to LCD cells and lower power consumption. Table 3 shows major characteristics and features of the TFT-LCD. FIG. 6 shows how contrast ratio depends on viewing angle.

Tanaka, Y., Shibusawa, M., Dohjo, M., Tomita, O., Uchikoga, S., and Yamanaka, H., "A 13.8-in.-Diagonal High-Resolution Multicolor TFT-LCD for Workstations," *SID* 92 *Digest*, 1992, pp. 43–46, describe an a-Si TFT-LCD with 1152×900 pixels that achieves a 30% aperture ratio and 4096-color graphic displays. FIG. 3 shows a cross-sectional view of a self-aligned TFT. FIG. 4 shows how the reverse-tilt domain size A and B are defined. Table 2 shows the specification for a TFT-LCD.

SUMMARY OF THE INVENTION

The invention is based on the discovery of a new technique for providing a high resolution display using a thin-film structure. The technique provides a very dense array of binary control units with an area large enough to present images for direct viewing, and has been implemented in an array of approximately 510 $cm^2$.

Conventional active-matrix liquid crystal displays (AMLCDs) fall into two general groups. One group includes displays with areas large enough for direct viewing, such as computer and television displays; with technology available prior to this invention, these displays typically achieved densities of approximately 40–48 cells per centimeter (cm). A second group includes displays with small areas for projection onto larger screens, which achieved densities as high as 200 cells/cm or more.

The new technique provides an array of binary control units with an area large enough for direct viewing, but with a density significantly greater than 48 binary control units per centimeter (48/cm). Densities greater than 60/cm have been achieved. For example, a display measuring 33 cm diagonally, having an area of approximately 510 $cm^2$, has been successfully produced with the same density in both vertical and horizontal directions, approximately 111/cm, so that the effective widths of the binary control units in each direction are approximately 90 microns (μm). The display has 3072 columns of binary control units and 2048 rows, for a total of approximately 6.3 million binary control units.

The array is part of a product that includes a substrate and a thin-film structure formed at a surface of the substrate. The thin-film structure includes the array. Each binary control unit has a lead for receiving a unit drive signal. Each binary control unit responds to its unit drive signal by causing presentation of a segment of images presented by the array. Each binary control unit can present a segment with either a first color having a maximum intensity or a second color having a minimum intensity. Each binary control unit's unit drive signal can cause the binary control unit to present its first and second colors.

The technique could be implemented with unit drive signals that have first and second levels. Each binary control unit could respond to the first level by presenting its first color and to the second level by presenting its second color.

The new technique can be implemented in an AMLCD with a liquid crystal cell and with each binary control unit positioned adjacent a part of the liquid crystal cell. Each binary control unit can control a transmission characteristic of the adjacent part of the liquid crystal cell. In a monochrome display, all binary control units can present the same first color and the same second color; as a result, the display can present one or more intermediate colors by presenting an appropriate pattern of the first and second colors. In a color display, a color filter can have a part for each binary control unit, so that three different sets of binary control units have three different non-gray first colors even though all the binary control units have the same second color; as a result, the display can present additional non-gray colors by presenting an appropriate pattern of the non-gray first colors.

Each binary control unit can include a capacitive element such as a storage capacitor, a thin-film transistor, and lines connecting the leads of the thin-film transistor. One line connects one channel lead to the charging lead of the capacitive element. Another line connects the other channel lead to receive the unit drive signal. And yet another line connects the gate lead to receive a scan signal selecting the binary control unit.

The array can include scan lines, each connected to a row of binary control units, and data lines, each connected to a column. Polysilicon thin-film transistor (TFT) circuitry or conventional silicon integrated circuits connected to pads on the data lines can provide unit drive signals, while polysilicon TFT circuitry or conventional silicon integrated circuits connected to pads on the scan line can provide scan signals. The new technique can provide a display for any appropriate machine, such as a computer, a television, a copier, and so forth. Because it can be used to present images with superior quality, the display may be especially useful for proofing pages before they are printed.

The new technique described above is advantageous compared to conventional AMLCDs for direct viewing because it provides significantly higher resolution. In addition, the resulting display has improved viewing angle due to exceptional off axis performance and a brighter image.

Conventional active matrix displays drive cells to intermediate voltage levels in order to render shades of gray (or another color) between the brightest and darkest states available. The above technique can limit the driven states of each cell to two saturated states corresponding to the brightest and darkest states available; intermediate gray scales can be rendered by the use of dithering techniques with no artifacts being visible to a viewer under normal viewing conditions and at normal viewing distances due to the very high cell density. Driving all the cells to only saturated states offers significant advantages since the visible intensity at a cell is relatively insensitive to, for example, changes in temperature or fluctuations in drive drive voltage. The dependence of perceived gray level on viewing angle is also greatly reduced.

The binary driving technique provides at least two distinct manufacturing advantages: First, the fact that each binary control unit requires only one bit of data, compared with three, six, or eight bits in a conventional display, means that the binary control unit and the external drive circuitry is simple and low cost and does not require temperature correction and the like, so manufacturing is cheaper. Second, the array structure itself is simpler and less susceptible to defects arising during manufacturing. For example, the TFT is smaller, with a small area of thin gate dielectric and a small storage capacitor area. Thus, there is less chance that a defect, such as a weak spot in the deposited dielectric or a particle, will fall in a critical part of the array, such as the TFT or the storage capacitor, and prevent the array from functioning.

The following description, the drawings, and the claims further set forth these and other aspects, objects, features, and advantages of the invention.

DETAILED DESCRIPTION

A. Conceptual Framework

Figure 1:
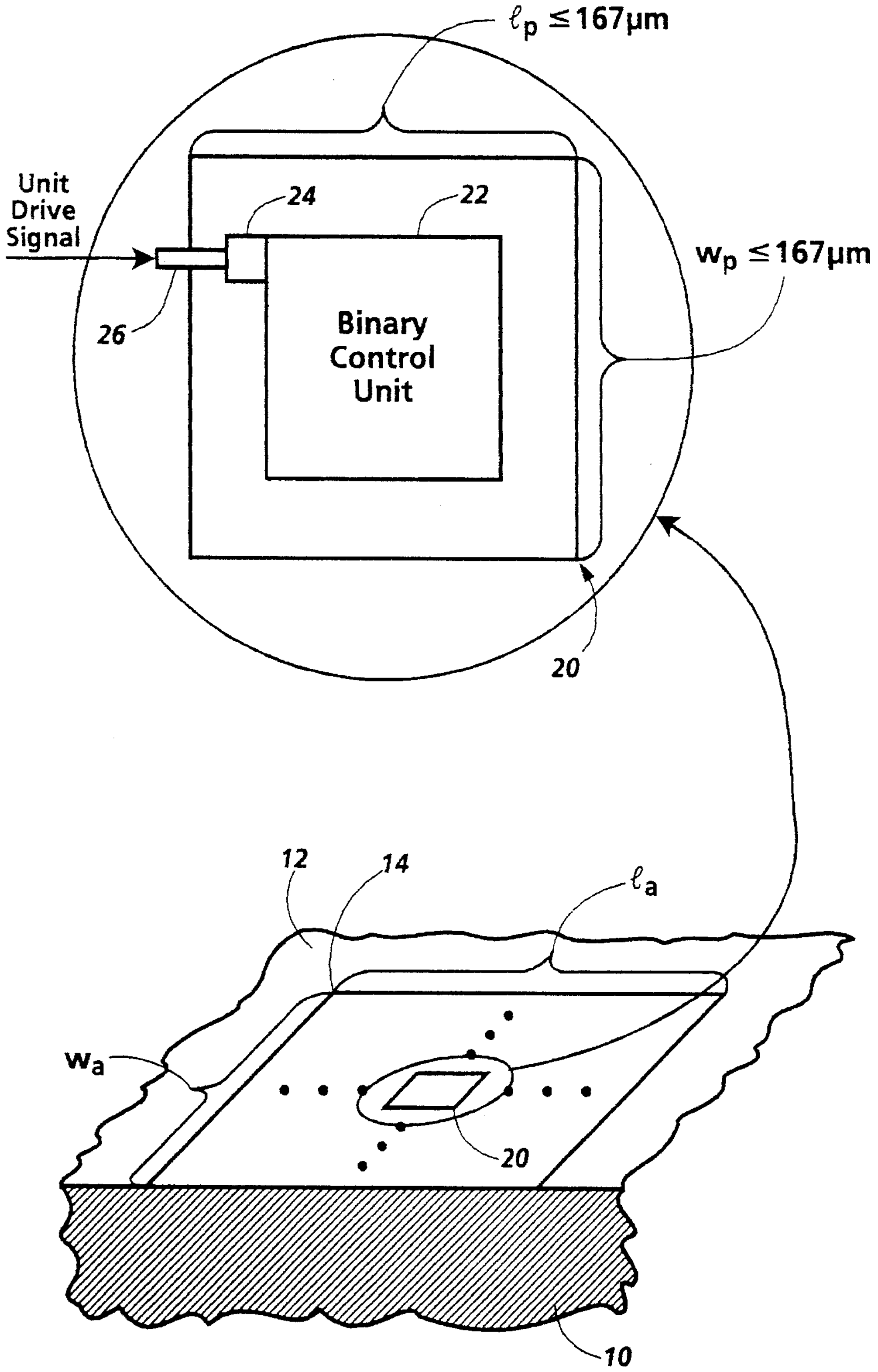
FIG. 1 is a schematic diagram showing an array of binary control units with an array large enough for direct viewing, with binary control unit densities of at least 60/cm. and with each binary control unit responding to a unit drive signal by presenting a segment with either a maximum or minimum intensity.

The following conceptual framework is helpful in understanding the broad scope of the invention, and the terms defined below have the indicated meanings throughout this application, including the claims. "Circuitry" or a "circuit" is any physical arrangement of matter that can respond to a first signal at one location or time by providing a second signal at another location or time, where the second signal includes information from the first signal. Circuitry "stores" a first signal when it receives the first signal at one time and, in response, provides the second signal at another time. Circuitry "transfers" a first signal when it receives the first signal at a first location and, in response, provides the second signal at a second location.

Any two components are "connected" when there is a combination of circuitry that can transfer signals from one of the components to the other. For example, two components-are "connected" by any combination of connections between them that permits transfer of signals from one of the components to the other. Two components are "electrically connected" when there is a combination of circuitry that can transfer electric signals from one to the other.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow. An "integrated circuit" is a circuit formed at a substrate's surface by batch processes such as deposition, lithography, etching, oxidation, diffusion, implantation, annealing, and so forth.

A "thin-film structure" is an electric structure that is formed at a surface of an insulating substrate. A thin-film structure could be formed, for example, by deposition and patterned etching of films on the insulating substrate's surface.

An "error" in circuitry that includes a thin-film structure is a part of the circuitry that does not function properly due to random or uncontrolled events that occur during production of the thin-film structure. An act "repairs" an error by modifying the circuitry with the error so that the circuitry functions properly.

A "lead" is a part of a component at which the component is electrically connected to other components. A "line" is a simple conductive component that extends between and electrically connects two or more leads. A lead of a component is "connected" to a lead of another component when the two leads are electrically connected by a combination of leads and lines. In an integrated circuit, leads of two components may also be "connected" by being formed as a single lead that is part of both components.

A "channel" is a part of a component through which electric current can flow. A channel is "conductive" when the channel is in a state in which current can flow through it.

A "channel lead" is a lead that connects to a channel. A channel may, for example, extend between two channel leads.

A "transistor" is a component that has a channel that extends between two channel leads, and that also has a third lead-referred to as a "gate lead" or simply "gate"-such that the channel can be switched between high impedance and low impedance by signals that change potential difference between the gate and one of the channel leads, referred to as the "source." The channel lead that is not the source is referred to as the "drain."

A "thin-film transistor" or "TFT" is a transistor that is part of a thin-film structure.

A "capacitive element" is a component that stores a voltage level by storing charge.

An "image" is a pattern of physical light.

When an image is a pattern of physical light in the visible portion of the electromagnetic spectrum, the image can produce human perceptions.

An image may be divided into "segments," each of which is itself an image. A segment of an image may be of any size up to and including the whole image.

An "image output device" is a device that can provide output defining an image.

A "display" is an image output device that provides information in a visible form. A display may, for example, include a cathode ray tube; an array of light emitting, reflecting, or absorbing elements; a structure that presents marks on paper or another medium; or any other structure capable of defining an image in a visible form. To "present an image" on a display is to operate the display so that a viewer can perceive the image.

A "segment of images" presented by a display is at the same relative position within all the images. A segment of images can be presented "with either of first and second colors" if the segment can be presented with the first color or with the second color, but not with both colors at once. A "binary segment" of images presented by a display is a segment that can be presented with either of first and second colors.

Circuitry or a circuit "causes presentation of a segment" or "presents a segment" of images if the segment is presented in response to the circuitry or circuit.

A "light control unit" is a part of a display that is structured to receive a signal and to respond to its signal by causing presentation of an image segment with one of a set of colors.

In a thin-film structure that is part of a display that presents images, a "binary control unit" is a circuit that is able to cause presentation of a segment of images with either of first and second colors. An "array of binary control units" is an arrangement of binary control units that can cause presentation of segments that together form an image. An array of binary control units can, for example, extend in first and second directions that are perpendicular.

A binary control unit causes presentation of a color that has a "maximum intensity" if the color has the maximum intensity or brightness that the binary control unit can cause to be presented. A binary control unit causes presentation of a color that has a "minimum intensity" if the color has the minimum intensity or brightness that the binary control unit can cause to be presented.

A binary control unit responds to a signal "by causing presentation of a segment" or "by presenting a segment" if the signal determines how the binary control unit presents the segment. For example, the signal can have a number of levels, with each level causing the binary control unit to present the segment with a color for the level.

A "density" of binary control units in a direction is an average number of the binary control units per unit of extent in the direction. For example, a density of 60/cm means that, on average, each centimeter includes 60 binary control units.

In an array that extends in a first direction, the "effective width" of binary control units in the first direction is the inverse of the density of binary control units in the first direction. In an array with a density of 60/cm, for example, the effective width of binary control units is 1/60th of one centimeter, or 167 μm.

The "area" of an array of binary control units that extends in first and second directions is the product of the array's extent in the first direction and its extent in the second direction. For example, an array the size of an index card that measures 7.5 cm×12.5 cm is 93.75 $cm^2$.

A "liquid crystal cell" is an enclosure containing a liquid crystal material.

A "liquid crystal display" or "LCD" is a display that includes a liquid crystal cell with a light transmission characteristic that can be controlled in parts of the cell by an array of light control units to cause presentation of an image. An "active matrix liquid crystal display" or "AMLCD" is a liquid crystal display in which each light control unit has a nonlinear switching element that causes presentation of an image segment by controlling a light transmission characteristic of an adjacent part of the liquid crystal cell. The light control units can, for example, be binary control units.

A "usual viewing distance" at which an array of light control units is viewed is a distance at which a human would ordinarily view the array. For example, the usual viewing distance of a computer display is typically between 40–60 cm.

A "human with normal vision" is a human whose vision meets an appropriate criterion for normalcy. For example, the criterion could require 20/20 equivalent or better corrected visual acuity, normal vertical and lateral phoria, normal stereopsis, and normal color vision.

An array has an area that is "large enough to present images for direct viewing" if the area of the array is large enough that it can present images that are perceptible as images to a human with normal vision viewing the array at usual viewing distances without an optical aid such as a magnifying lens, a microscope, glasses, contact lenses, binoculars, or a telescope.

B. General Features

FIGS. 1 shows an array of binary control units, illustrating general features of the invention.

Insulating substrate 10 in FIG. 1 has a surface at which thin-film structure 12 is formed. Thin-film structure 12 includes array 14 of binary control units for presenting images. As shown, array 14 has width $w_a$ and length $l_a$, with an area ($w_a \times l_a$) large enough that array 14 can present images for direct viewing.

Area 20 of array 14 is a square that includes one of the binary control units and that has a side length equal to the effective widths of the binary control units in array 14. Area 20 is illustratively shown in an expanded view. Binary control unit 22 has lead 24 connected to line 26 for receiving a unit drive signal.

Binary control unit 22 responds to the unit drive signal received by lead 24 by causing presentation of a segment with either of two colors, one color having the maximum intensity binary control unit 22 can provide, the other color having the minimum intensity binary control unit 22 can provide. When the unit drive signal received by lead 24 changes, binary control unit 22 responds by changing from one of the colors to the other. The binary control units in array 14 can present images by responding in this manner to their unit drive signals.

Area 20, the area that includes binary control unit 22, has width $w_p$ and length $l_p$, each of which is no greater than 167 μm. Therefore, the densities of binary control units in array 14 in both the width and length directions are approximately 60/cm or more.

C. Implementation

The general features described above could be implemented in numerous ways to provide a display with a dense array of binary control units that has an area large enough to present images for direct viewing. As described below, the general features have been implemented to provide both monochrome and color displays. The implementations described below are also described in Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Tilton, M., and Silverstein, L. D., "P-70: A 6.3-Mpixel AMLCD," *SID* 93 *Digest*, 1993, pp. 704–707.

C.1. Binary Control Unit

Figure 2:
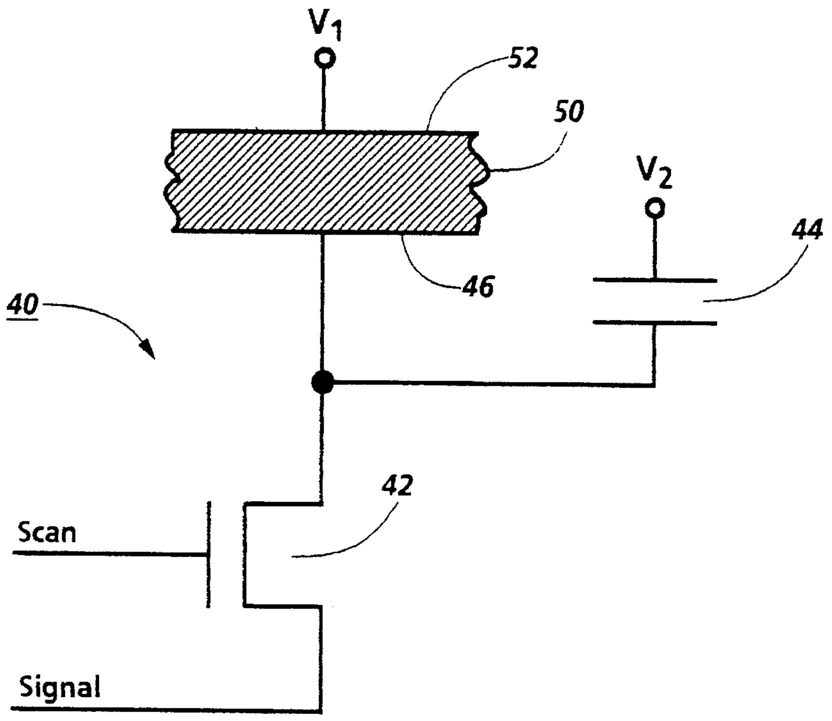
Fig. 2 (Prior Art)
FIG. 2 is a schematic circuit diagram showing electrical components of a conventional binary control unit.

FIG. 2 shows the electrical structure of a conventional binary control unit.

Figure 3:
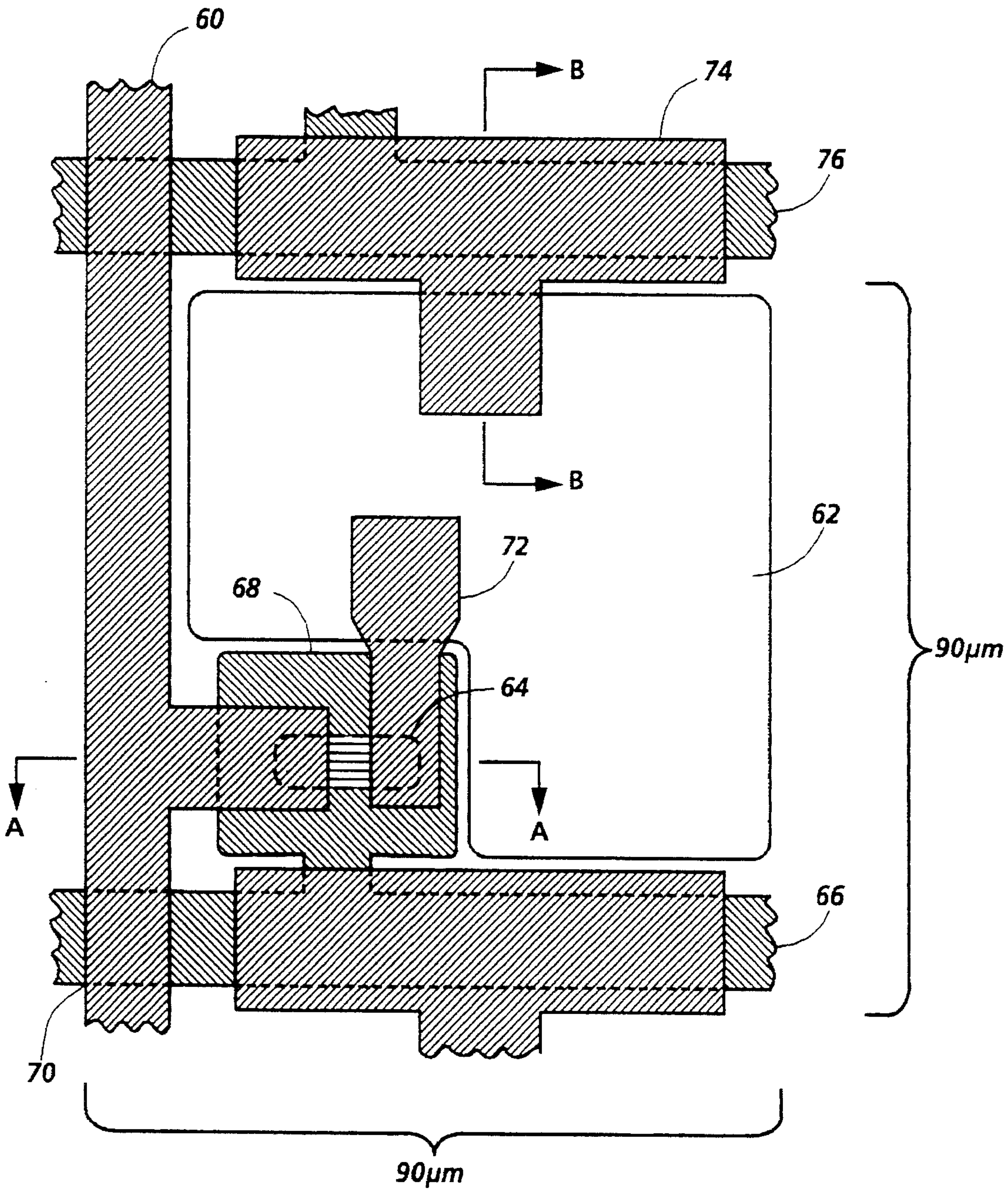
FIG. 3 is a schematic layout diagram showing features of a layout of a binary control unit that can be used in implementing an array like that in FIG. 1.

FIG. 3 shows a layout of a binary control unit that can be used in nplementing an array like that in FIG. 1.

As shown in FIG. 2, binary control unit 40 includes transistor 42, storage capacitor 44, and electrode 46 which, with liquid crystal material 50 and opposite electrode 52, defines a part of a liquid crystal cell in which binary control unit 40 controls light transmission. As shown, the gate lead of transistor 42 is a scan lead or electrode and one of the channel leads of transistor 42 is a signal lead or electrode. The other channel lead of transistor 42 is connected to electrode 46, while opposite electrode 52 is at voltage $V_1$. Similarly, the other channel lead of transistor 42 is connected to a charging lead of capacitor 44, with the other lead of capacitor 44 at voltage $V_2$. Features in FIG. 2 are described in more detail in Kaneko, E., *Liquid Crystal TV Displays: Principles and Applications of Liquid Crystal Displays*, Tokyo, KTK Scientific, 1987, p. 212–277.

FIG. 3 shows part of a layout of a binary control unit. The layout of FIG. 3. can be understood as an implementation of the conventional electrical structure of FIG. 2, but, in contrast with conventional techniques, the layout of FIG. 3 can be used to implement each of a dense array of binary control units as in FIG. 1. The layout in FIG. 3 implements transistor 42 in FIG. 2 with a non-self-aligned inverted staggered thin-film transistor (TFT). The channel of the TFT is approximately 5 μm wide and 16 μm long, and the gate lead extends beyond the channel between 5–8 μm.

Several layers are shown in FIG. 3, with upper layers that are farthest from the substrate's surface obscuring lower layers. The uppermost layer shown in FIG. 3 is a top metal layer, which forms data line 60 connected to a channel lead of transistor 42; the top metal layer also forms several other features described below. The next layer shown is a layer of indium-tin-oxide (ITO), which forms transparent electrode 62, serving as electrode 46 in FIG. 2. The next layer is a top nitride layer, which forms island 64, part of transistor 42; the top nitride layer can form other features as mentioned below. The lowest layer shown is a bottom metal layer, which forms gate line 66 and, connected to it, gate lead 68, which serves as the gate lead of transistor 42.

Data line 60 can be implemented with a resistance of 0.2 ohm/sq. and can be driven at −8 V, 0 V, and +8 V. Data line 60 provides a data signal to a column of binary control units, one of which is shown in FIG. 3. The part of data line 60 that extends over gate lead 68 connects to the source lead of transistor 42.

Gate line 66 similarly provides a scan signal to a row of binary control units. Gate line 66 can be implemented with a resistance of 1.4 Ohm/Sq and can be driven at +15 V and −15 V.

Data line 60 and gate line 66 are each 10 μm wide. Data line 60 crosses over gate line 66 in crossover region 70. Crossover region 70 can include an insulator formed by the top nitride layer, and other features as necessary to ensure that the two lines conduct signals adequately and that signals in the two lines do not interfere.

Transparent electrode 62 connects to the drain lead of transistor 42 through drain line 72, formed by the top metal layer. Therefore, when transistor 42 is conductive due to a scan signal provided to gate lead 68 by gate line 66, transparent electrode 62 receives and-stores a drive signal from data line 60 through drain line 72.

Transparent electrode 62 also connects to charging lead 74, which implements one electrode of storage capacitor 44 in FIG. 2 and is formed by the top metal layer. Gate line 76, formed by the bottom metal layer, implements the other electrode of storage capacitor 44; gate line 76 also provides a scan signal to the preceding binary control unit in the same column. The ratio of the capacitance of capacitor 44, when inplemented as in FIG. 3, to the maximum liquid crystal capacitance is approximately 1.4, with each capacitance being a few tenths of a picofarad.

The binary control unit shown in FIG. 3 is square, and an array of identical binary control units would have effective widths in the row and column directions of 90 μm×90 μm. As a result, densities of approximately 111/cm can be achieved.

C.2. Array

Figure 4:
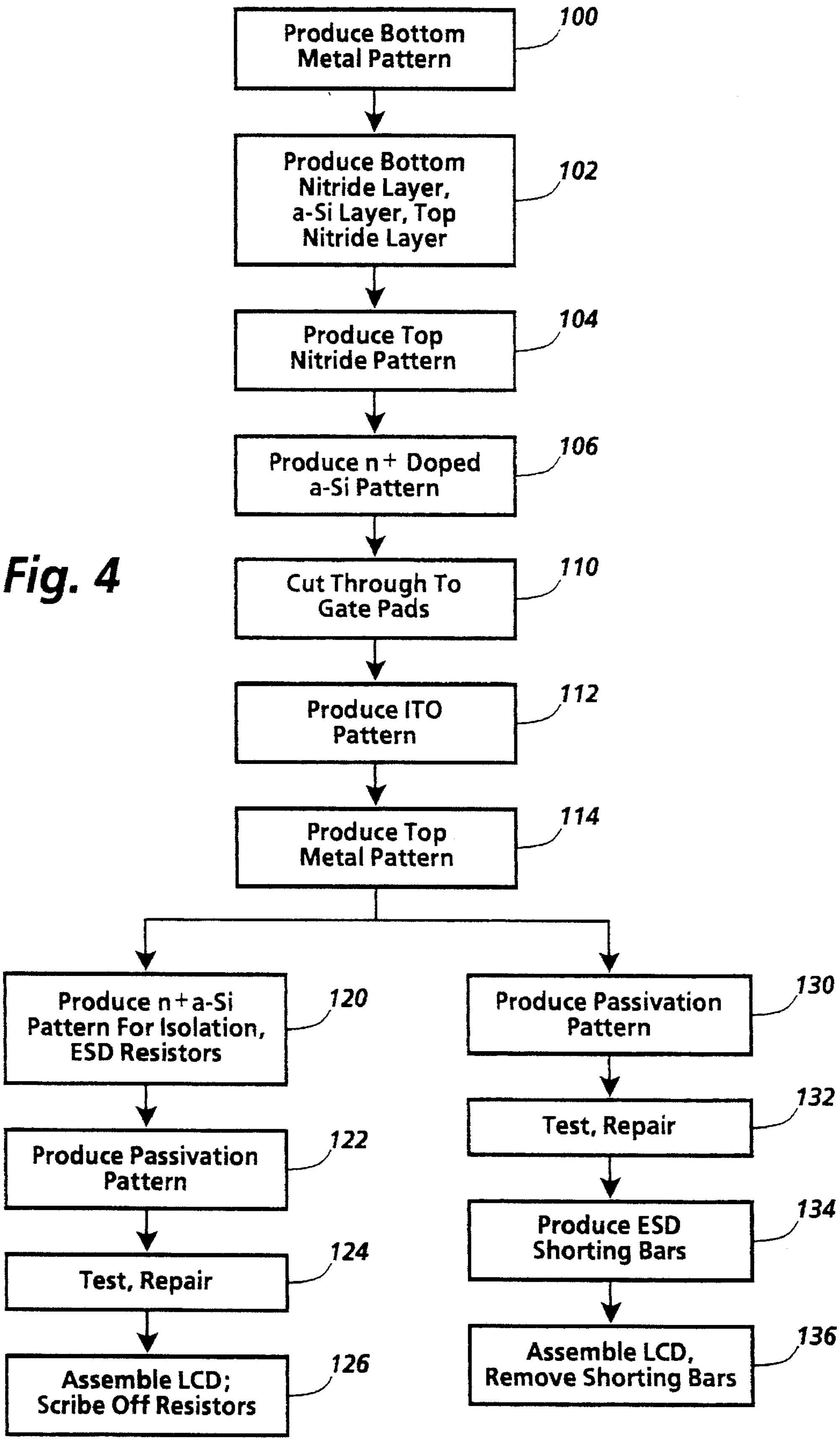
FIG. 4 is a flow chart showing acts in a process that can implement the layout of FIG. 3.
Figure 5:
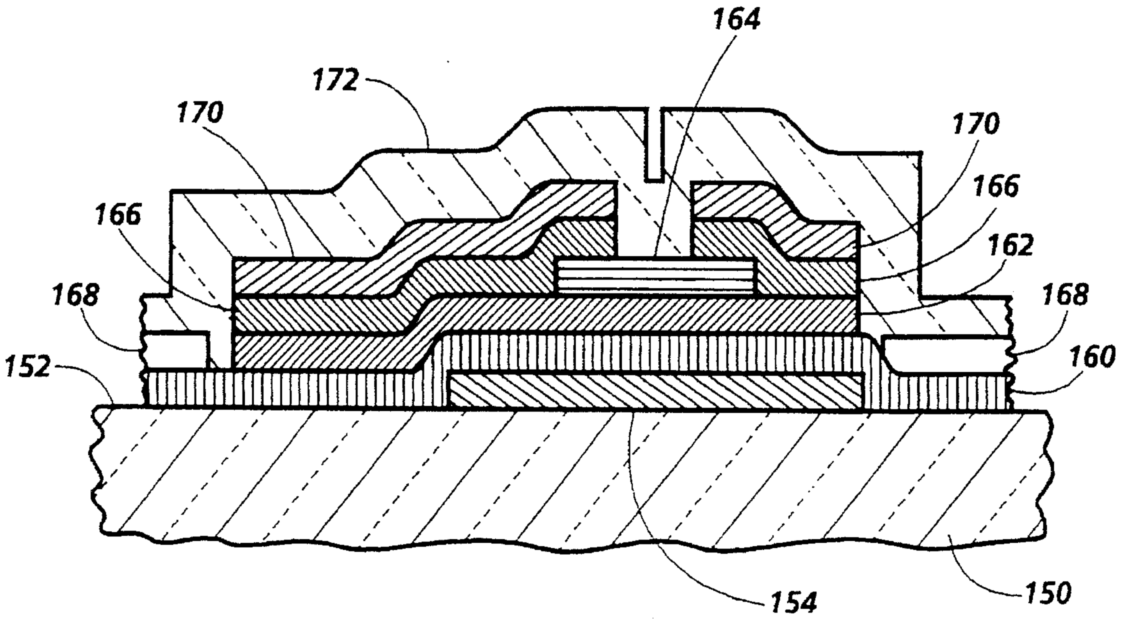
FIG. 5 is a cross-sectional view along the line A—A in FIG. 3 of a thin-film structure produced by the acts in FIG. 4.
Figure 6:
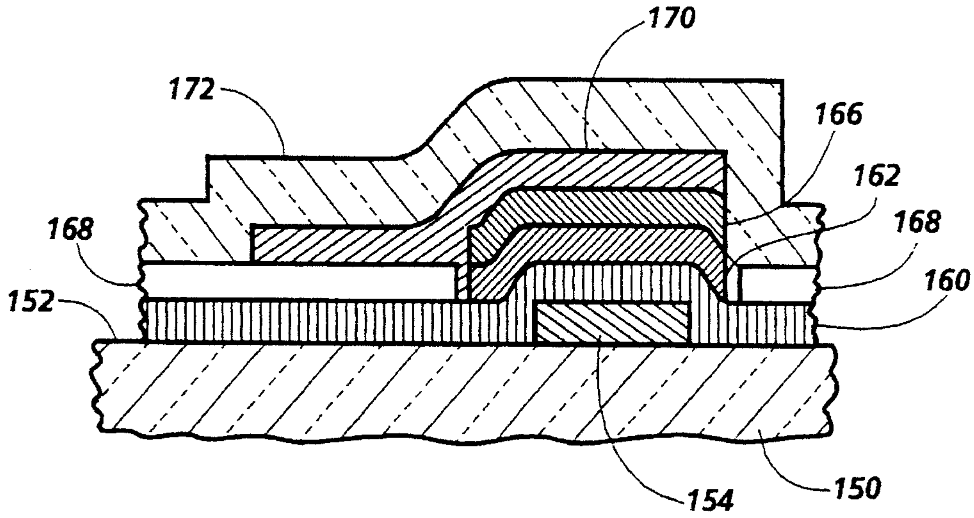
FIG. 6 is a cross-sectional view along the line B—B in FIG. 3 of a thin-film structure produced by the acts in FIG. 4.
Figure 7:
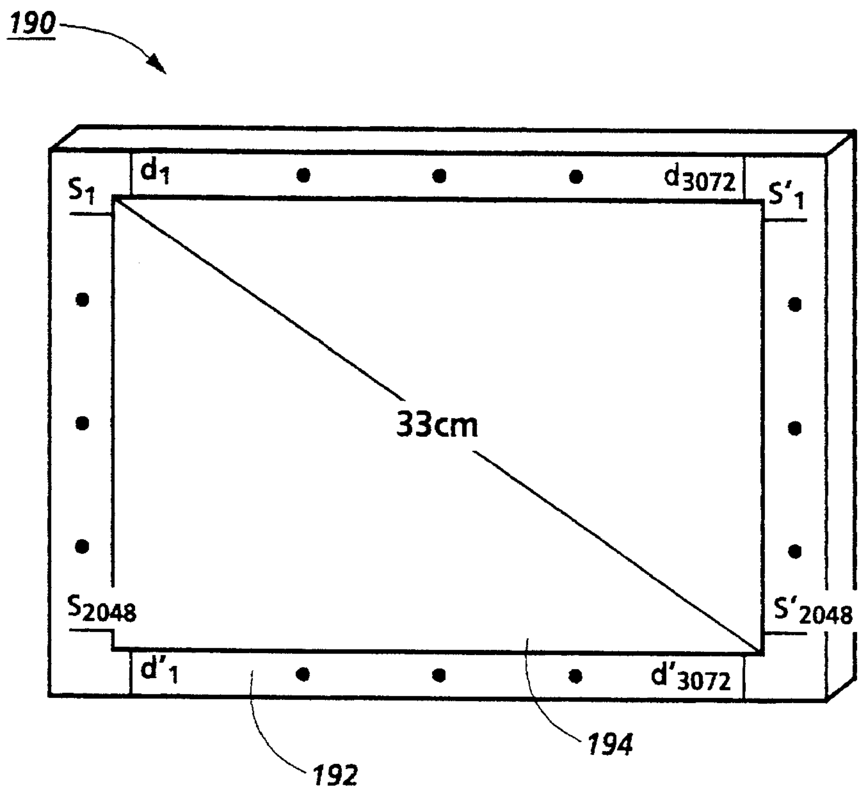
FIG. 7 is a perspective view of a product produced with the process of FIG. 4.

FIG. 4 shows acts in a process that can be used to produce an array with binary control units implementing the features of FIG. 3. FIG. 5 shows a cross-section along line A—A in FIG. 3 for a structure produced as in FIG. 4. FIG. 6 shows a cross-section along line B—B. FIG. 7 shows a product produced as in FIG. 4.

In FIG. 4, the act in box 100 begins by producing a bottom metal pattern that forms gate line 66 and gate lead 68 for each row of binary control units in an array and gate lead 68 for each binary control unit in each row. Each gate line 66 can have two pads, one at each end, for making connections to components off the substrate. The act in box 100 can be implemented by depositing metal using a physical vapor deposition process such as sputtering. The exposed photoresist can then be developed away to form a pattern of mask material over parts of the metal that are shaped like the scan lines. An etch appropriate to the metal can then remove the underlying metal in exposed areas, leaving the desired bottom metal pattern, from which the unexposed photoresist can be removed to prepare for subsequent layers.

Various specific techniques could be used to implement the act in box 100. In one working implementation, the bottom metal layer is 1500 angstroms thick and includes molybdenum and chromium, as described in copending, coassigned U.S. patent application Ser. No. 08/235,008, entitled "Thin-Film Structure with Conductive Molybdenum-Chromium Line," incorporated herein by reference. The bottom metal layer could be etched to obtain tapered gate lines as described in copending, coassigned U.S. patent application Ser. No. 08/235,010, entitled "Thin-Film Structure With Tapered Feature," incorporated herein by reference. Various other techniques could be used to produce the bottom metal layer, including techniques that provide a shunt layer such as titanium/tungsten over aluminum and techniques that provide alternating layers of aluminum to prevent hillock formation.

The act in box 102 then produces a bottom nitride layer, an amorphous silicon layer, and a top nitride layer. The act in box 102 has been implemented with plasma chemical vaper deposition (CVD) using a trilayer deposition or etch stop process that deposited three layers in sequence without breaking vacuum. The bottom nitride layer can be silicon nitride deposited at 300°–380° C. to obtain a refractive index of 1.87–1.97 and a thickness of 3000 angstroms. The amorphous silicon layer can be deposited at 230°–300° C. with 5–12% hydrogen, with a thickness of 300–500 angstroms. The top nitride layer can be silicon nitride deposited at 200°–250° C. to obtain a refractive index of 1.97–2.07 and a thickness of 1000–1500 angstroms.

Because the amorphous silicon layer acts as an etch stop, subsequent etching can remove the top nitride layer without removing the amorphous silicon layer and the bottom nitride layer. The act in box 104 therefore forms a pattern of top nitride. In addition to island 64 as in FIG. 3, the top nitride pattern can include an insulating layer in crossover region 70 that is sufficiently thick that signals in data line 60 and gate line 66 do not interfere, as described in more detail in copending, coassigned U.S. patent application Ser. No. 08/234,885, entitled "Thin-Film Structure with Insulating and Smoothing Layers Between Crossing Metal Lines," incorporated herein by reference.

The act in box 104 can be implemented with a photoresist exposure process as described above in relation to box 100, using a wet etch with 10 parts water per part of HF for 2.5 minutes or until clear to obtain a non-self-aligned TFT with island 64 significantly smaller than the gate lead. In a working implementation, island is approximately 5 μm in width, approximately 16 μm in length, and its edge is between 5–8 μm from the edge of the gate lead, an arrangement that prevents light from the substrate side from causing leakage in the TFT's channel. Since the top nitride pattern includes only areas above gate line 66 and other gate lines, a backside exposure could also be used in combination with an appropriate mask to obtain a top nitride pattern that extends to the edge of the gate lead within the TFT. The backside exposure technique could be used to produce a self-aligned TFT, which could improve TFT performance by minimizing overlap of the top and bottom metal layers. In any event, the edge of the top nitride pattern should not be exactly aligned with edges of gate line 66, either in the TFT or in crossover 70. The act in box 104 can also include cleaning with a solution of 200 parts water per part of HF for 30–60 sec to prepare the array for deposition of another layer of amorphous silicon.

The act in box 106 then produces a pattern of n+doped amorphous silicon, providing source and drain contacts. The act in box 106 can be implemented by first performing plasma CVD to deposit an n+doped amorphous silicon layer at 200°–250° C. with 5–15% hydrogen to a thickness of 1000 angstroms. The amorphous silicon can be doped, for example, with 0.5–2% phosphorous. Then, a photoresist exposure process as described above in relation to box 100 can be used with a dry plasma etch using 10 parts $CF_4$ per part of $O_2$ to remove the n+layer and the undoped amorphous silicon layer from the area in which transparent electrode 62 will be formed, leaving only the bottom nitride on the substrate. In crossover region 70 and in other areas under data line 60, the n+layer remains to form a smoothing layer so that data line 60 can be continuously formed, as described in copending, coassigned U.S. patent application Ser. No. 08/234,885, entitled "Thin-Film Structure with Insulating and Smoothing Layers Between Crossing Conductive Lines," incorporated herein by reference.

The act in box 110 cuts through layers deposited on the gate pads during the acts in boxes 102 and 106. The act in box 110 can be implemented with a photoresist exposure process as described above in relation to box 100, using an plasma etchant with 10 parts $CF_4$ per part of $O_2$. The act in box 110 can also make additional cuts to the gate lines for greater certainty of making metal-to-metal contact during subsequent steps.

The act in box 112 then produces an ITO pattern to form transparent electrode 62. The act in box 112 can be implemented by reactively sputter depositing a layer of ITO in 0.5–1.5% $O_2$ at room temperature to a thickness of 500–1000 angstroms. Then a photoresist exposure process as described above in relation to box 100 can be used with a wet etch of HCl to remove the ITO layer everywhere except transparent electrode 62. The mask used in this process can be the complement of the mask used in box 106, but with a slight bias so that the ITO layer is separated slightly from the n+ amorphous silicon layer. The remaining ITO layer can then be annealed at 200°–230° C. for an appropriate time period between one and three hours.

The act in box 114 produces a top metal pattern as shown in FIG. 3. The top metal layer can include a barrier layer and a conductive layer, with the barrier layer a metal that prevents diffusion of metal from the conductive layer into the n+amorphous silicon layer. The barrier layer can include chromium or titanium-tungsten, deposited at a pressure that produces a low stress layer. The conductive layer can be aluminum, for example.

The act in box 114 can be implemented by sputter depositing, in sequence without breaking vacuum, 500 angstroms of titanium/tungsten, 3000–4000 angstroms of aluminum, and 500–1000 angstroms of titanium/tungsten. Another sequence would be 500 angstroms of chromium followed by 4000 angstroms of aluminum. The act in box 114 can also use a photoresist exposure process as described in relation to box 100 with a wet etch to remove the top metal layer except from data line 60, drain lead 72, charging lead 74, and the gate pads exposed in box 110. For the three layers of top metal, the etch can be done in three steps, first etching titanium/tungsten with $H_2O_2$, then etching aluminum with a standard aluminum etchant, and then again etching titanium/tungsten with $H_2O_2$. The top metal layer on the gate pads allows easier bonding.

The act in box 120 produces a pattern of the n+layer remaining from box 106 in which the TFT leads are isolated and in which the n+layer provides electrostatic damage (ESD) resistors between all adjacent gate and data pads at the perimeter of the array. The act in box 190 can be implemented with a photoresist exposure process as described in relation to box 170 with conventional dry plasma etching techniques with 10 parts $CF_4$ per part of $O_2$ to remove the n+layer and the undoped amorphous silicon layer from the unmasked area. The mask need cover only the ESD resistors, since the top metal layer will prevent etching of n+layer under it. The act in box 120 isolates data line 60, drain line 72, and charging lead 74, ensuring isolation of the three TFT leads from each other.

The act in box 122 provides a passivation pattern. The act in box 120 can be implemented by depositing a passivation layer of silicon oxy-nitride at 180°–210° C. with a refractive index of 1.7–1.8, to a thickness of 6000 angstroms. A working implementation used 190° C. The passivation layer can be deposited at 180°–210° C. with a refractive index of 1.7–1.8, to a thickness of 6000 angstroms. The act in box 122 can use a photoresist exposure process as described in relation to box 100 with a plasma etch of 10 parts $CF_4$ to one part $O_2$ to remove the passivation layer from the data and gate pads.

The act in box 124 can then test the completed array, detecting and repairing any defective binary control units, any opens in scan or data lines, and any shorts between lines. Because the array is very dense, a few binary control units that are always OFF are not visible. For the same reason, magnification and other appropriate measures are necessary to detect defective binary control units. Once a defective binary control unit is detected, it can be repaired using a conventional laser repair station, such as from Photo Dynamics Inc., San Jose, Calif. or XMR Corp, Orange, Calif. The repair process can, for example, eliminate the electrical connection between gate line 66 and gate lead 68. Similarly, an open can be repaired by depositing a conductive layer across it and a short can be repaired by cutting scan lines on either side of the short.

Finally, the act in box 126 can then assemble a liquid crystal display (LCD), scribing off the ESD resistors after the LCD is assembled. ESD structures such as resistors are necessary for an active matrix liquid crystal display (AMLCD) because, during assembly, a thin layer of polyimide, approximately 100 angstroms, is buffed or rubbed before gluing. As a result, when the liquid crystal fills the cavity through capillary action, it is aligned. ESD structures prevent any resulting electrostatic charge from destroying the circuitry. ESD structures prevent the electrostatic charge from destroying the circuitry. Rather than using ESD resistors, which must be scribed and broken off after assembly, ESD shorting bars could be deposited between all adjacent pads after the act in box 120; the ESD shorting bars could be removed by wet etching after assembly, as shown at right in FIG. 4.

The act in box 130 produces a passivation pattern similarly to box 122. The act in box 132 then tests and repairs as in box 124. The act in box 134, however, produces ESD shorting bars. Then, the act in box 136 assembles an LCD, removing the shorting bars after a successful assembly.

The process in FIG. 4 is only one of many processes that could be used to implement the layout of FIG. 3. Other examples that could be used are described in copending, coassigned U.S. patent application Ser. Nos. 08/235,009, entitled "Electrically Isolated Pixel Element in a Low Voltage Activated Active Matrix Liquid Crystal Display and Method," and 08/235,015, entitled "Pixel Structure Having a Bottom-Layered Pixel Element for an Active Matrix Liquid Crystal Display and Method," both incorporated herein by reference.

FIGS. 5 and 6 show cross-sections along lines A—A and B—B in FIG. 3, respectively, for a thin-film structure produced using the process in FIG. 4. Layers of the same material are similarly shaded and bear the same reference number in the two drawings.

Substrate 150 has surface 152 at which a thin-film structure is formed, beginning with bottom metal-layer 154 which in FIG. 6 forms gate line 60 and in FIG. 5 forms gate lead 68. Over bottom metal layer 154 is bottom nitride layer 160, followed by amorphous silicon layer 162, which in FIG. 5 forms the channel of a TFT. Over amorphous silicon layer 162 is top nitride layer 164, forming island 64 in FIG. 5. Over top nitride layer 164 where it exists and over amorphous silicon layer 162 elsewhere is n+amorphous silicon layer 166, providing a source lead and a drain lead for the TFT in FIG. 5 and, together with bottom nitride layer 160 and amorphous silicon layer 162, forming a storage capacitor's dielectric in FIG. 6. Adjacent n+layer 166 is ITO layer 168, forming transparent electrode 62 in both FIGS. 5 and 6. Over n+layer 166 and ITO layer 168 is top metal layer 170, forming the source lead part of data line 60 and drain lead 72 in FIG. 5 and forming charging lead 74 in FIG. 6. Over top metal layer 170 and other exposed layers is passivation layer 172. Top nitride layer 164 could also be retained between bottom metal layer 154 and top metal layer 170 in FIG. 6 to provide a desired capacitance.

Product 190 in FIG. 7 illustrates features of one working implementation produced by the process of FIG. 4. The gate lines include molybdenum and chromium, and the top metal layer includes a barrier layer of chromium and a conductive layer of aluminum, as described above.

Product 190 includes substrate 192, a transparent glass sheet with outer dimensions of approximately 20 cm by 29 cm. Product 190 includes a thin-film structure formed at the surface of substrate 192 as described above. The thin-film structure includes array 194 with a diagonal of 33 cm, with a width of approximately 18.4 cm, with a length of approximately 27.6 cm, and therefore with an area of approximately 510 $cm^2$. Along the shorter sides of array 194 are scan line pads $s_1$ through $s_{2048}$ and $s'_1$ through $s'_{2048}$. Along the longer sides are data line pads $d_1$ through $d_{3072}$ and $d'_1$ through $d'_{3072}$.

As illustrated in FIG. 3, each binary control unit in array 194 is square with an area of 90 μm×90 μm, so that array 194 has binary control unit densities of approximately 111/cm in each direction. Because of the small sizes of the storage capacitors and the TFTs, each binary control unit has an aperture ratio of 26%. The scan line pads have the same density in the direction of the width and the data line pads have the same density in the direction of the length.

C.3. AMLCD Applications

Figure 16:
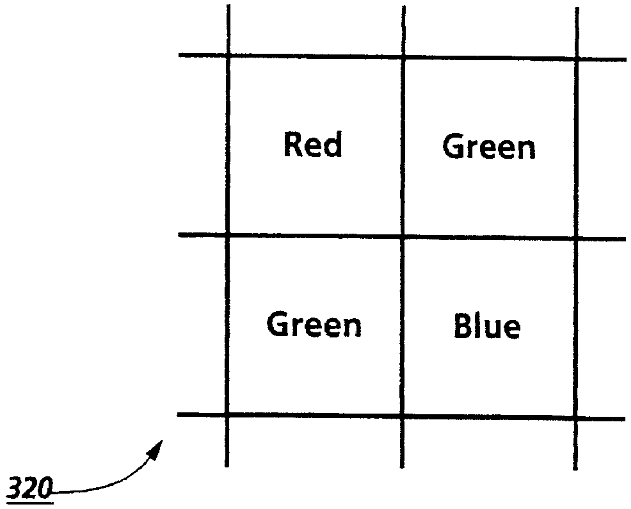
FIG. 16 is a schematic diagram of a pattern of color filter parts that can be used in the AMLCD assembly of FIG. 8.
Figure 8:
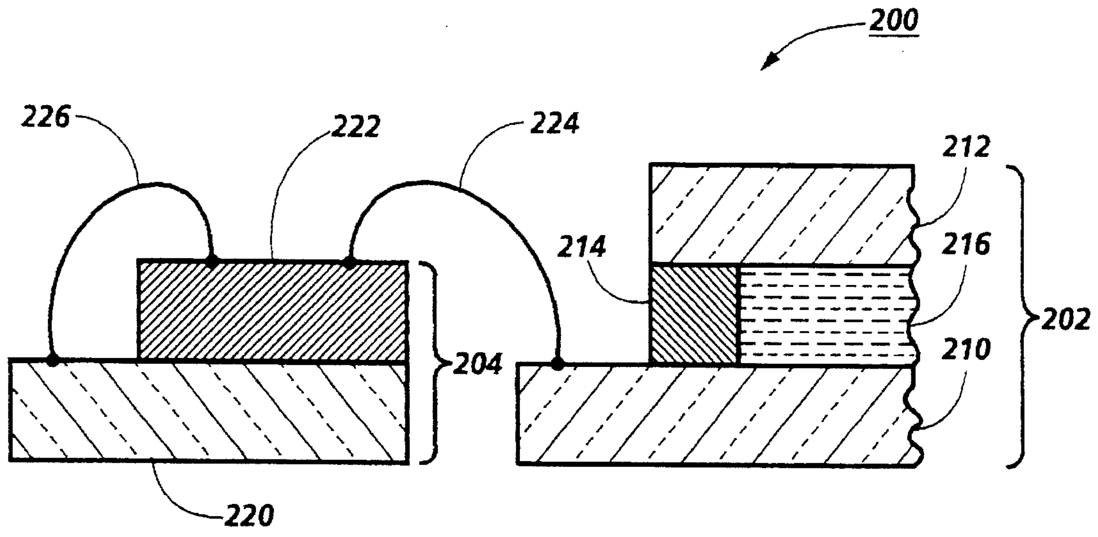
FIG. 8 is a cross-sectional view of an AMLCD assembly that includes a sheet as in FIG. 7, together with a connected driver assembly.
Figure 9:
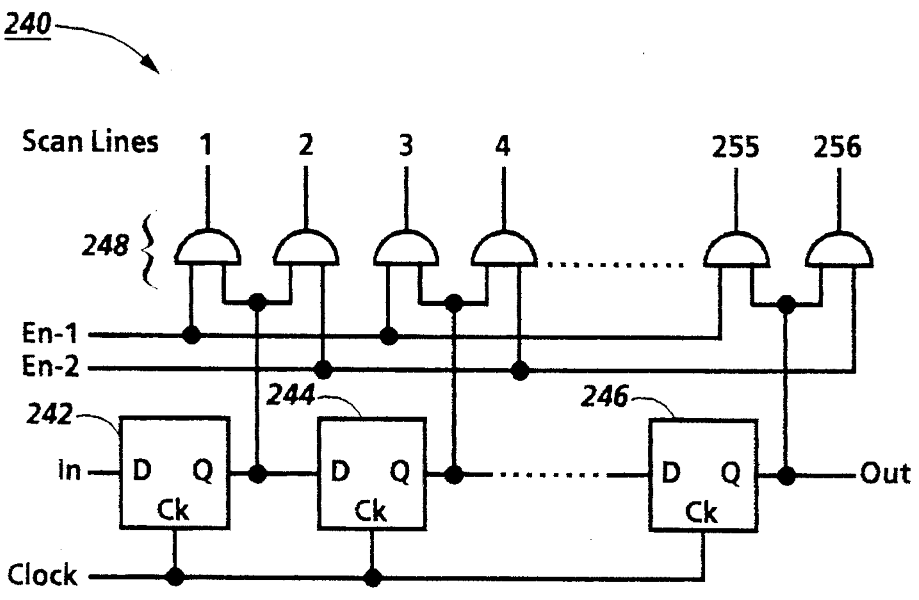
FIG. 9 is a schematic circuit diagram showing scan line signal circuitry that can be used in the driver assembly of FIG. 8.
Figure 10:
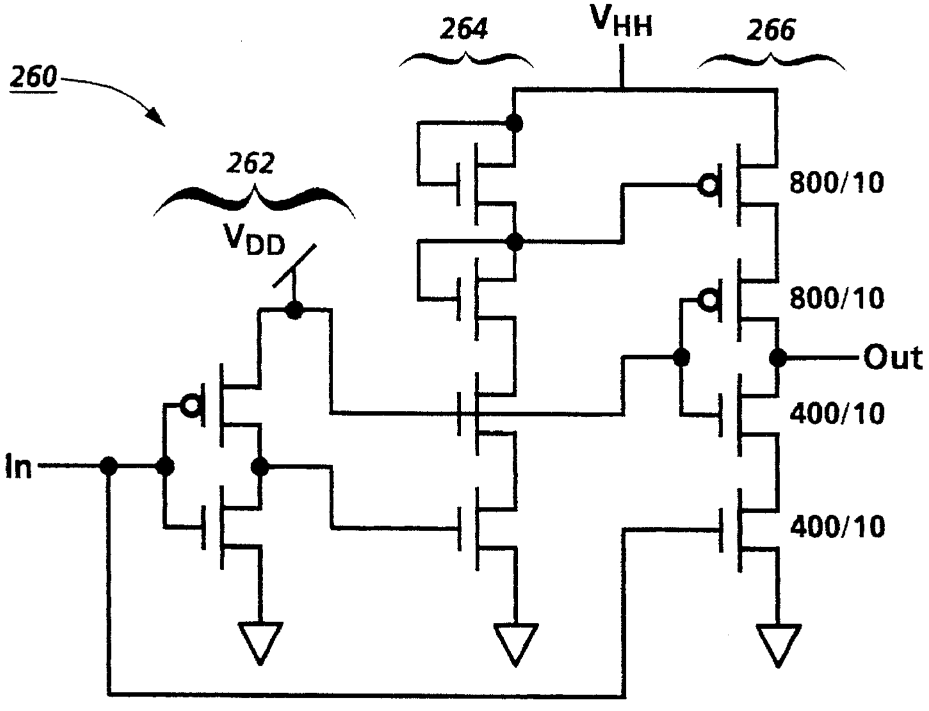
FIG. 10 is a schematic circuit diagram showing a buffer circuit than can be used as a scan line buffer with the circuitry of FIG. 9.
Figure 11:
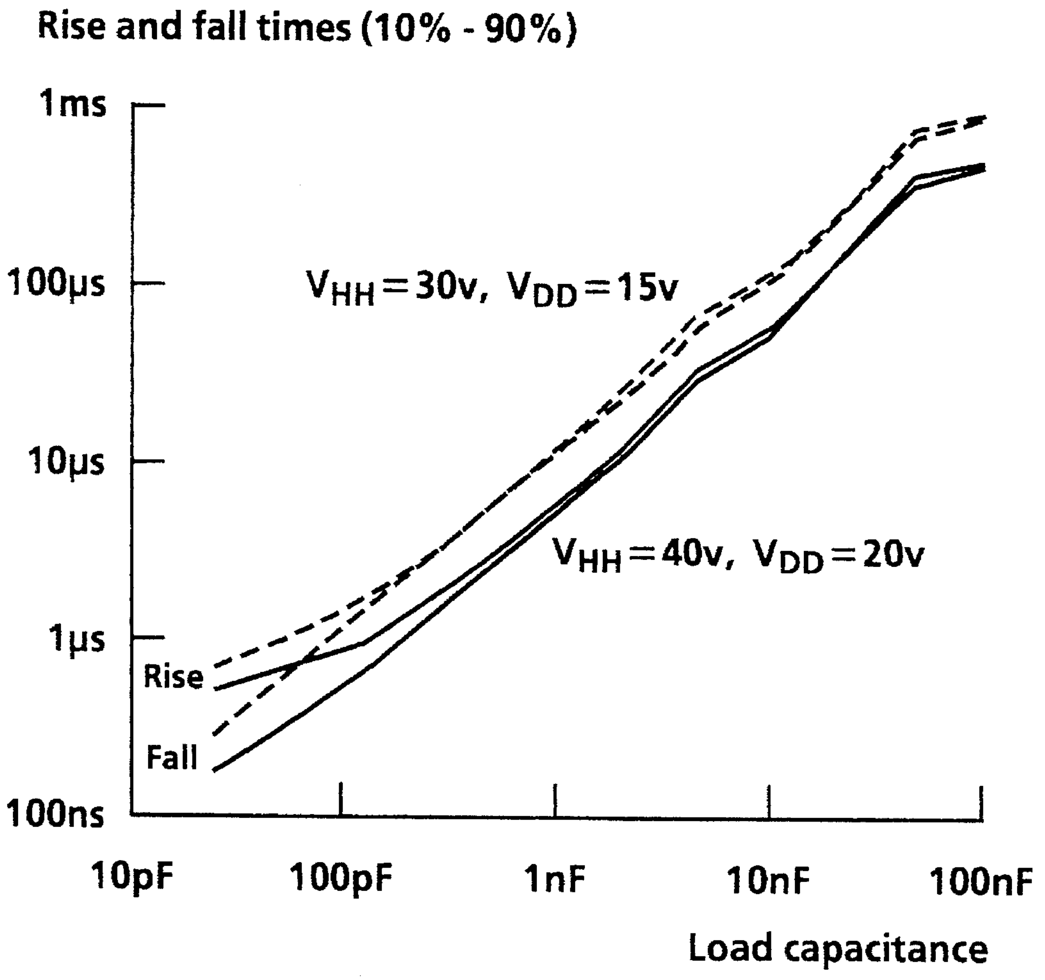
FIG. 11 is a graph showing rise and fall times for the buffer circuit of FIG. 10 as a function of load capacitance.
Figure 12:
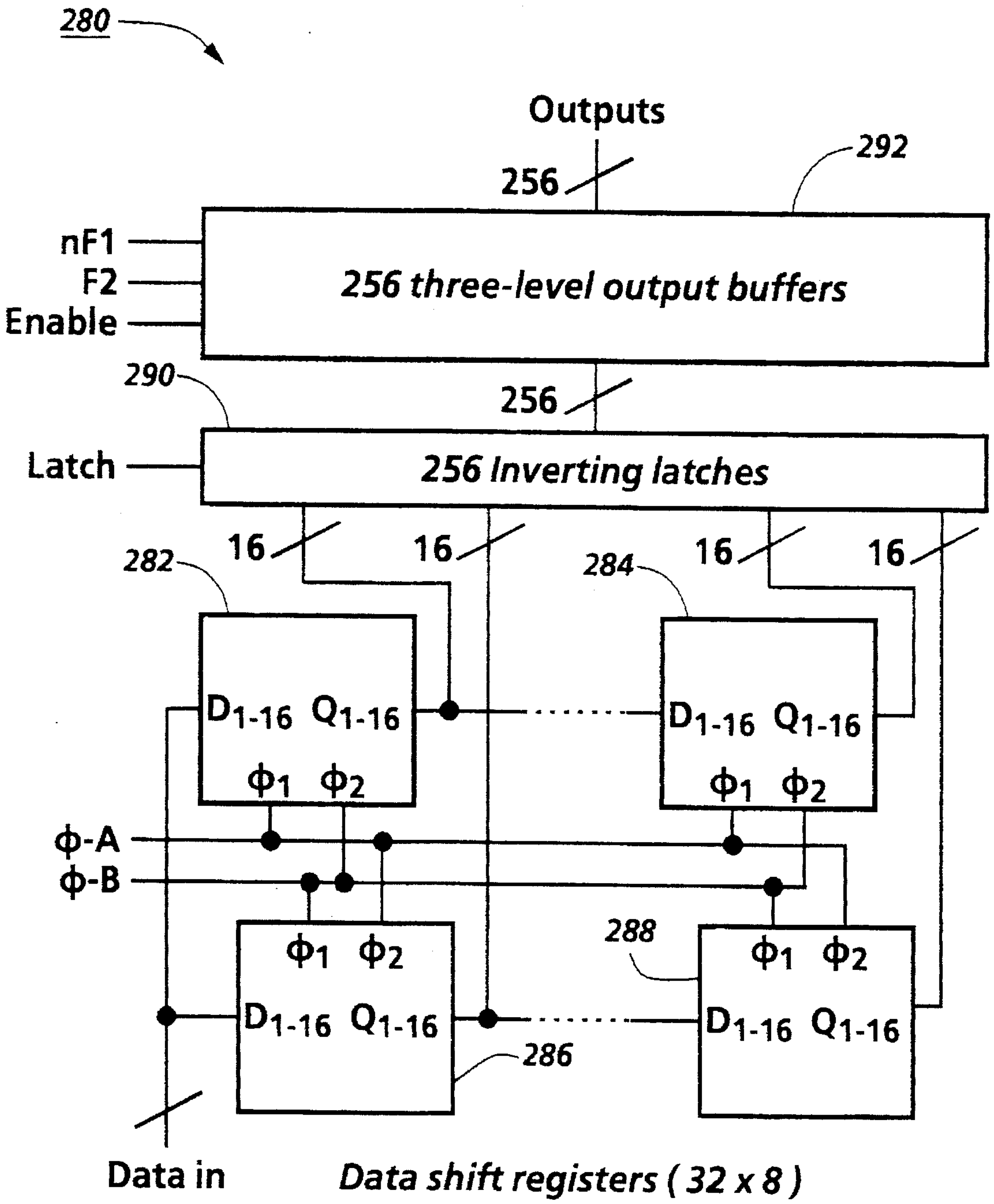
FIG. 12 is a schematic circuit diagram showing data line signal circuitry that can be used in the driver assembly of FIG 8.
Figure 13:
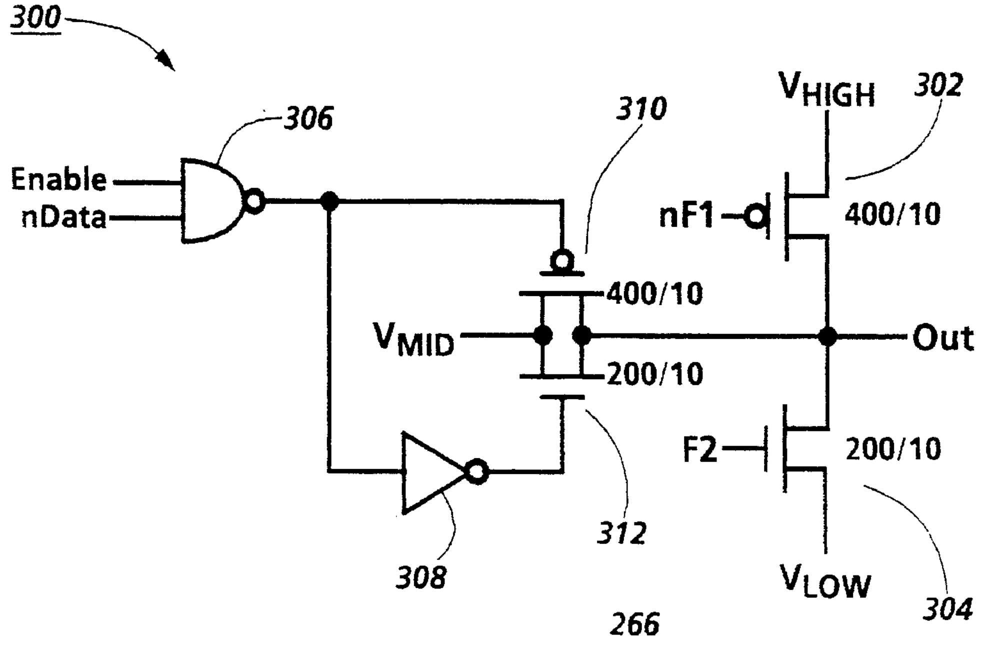
FIG. 13 is a schematic circuit diagram showing a buffer circuit than can be used to implement the output buffers in FIG. 12.
Figure 14:
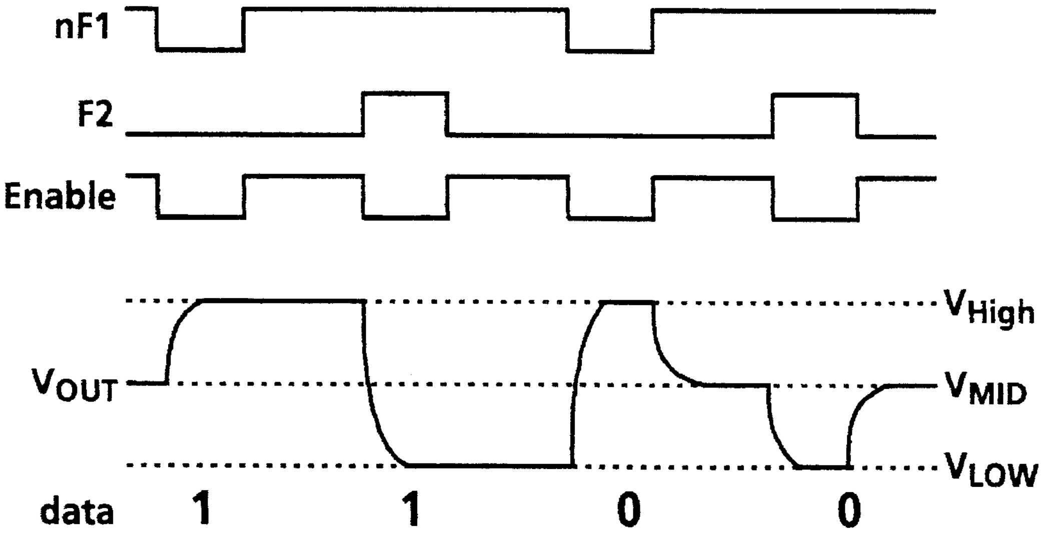
FIG. 14 is a timing diagram showing how the buffer circuit in FIG. 13 responds to its input signals.
Figure 15:
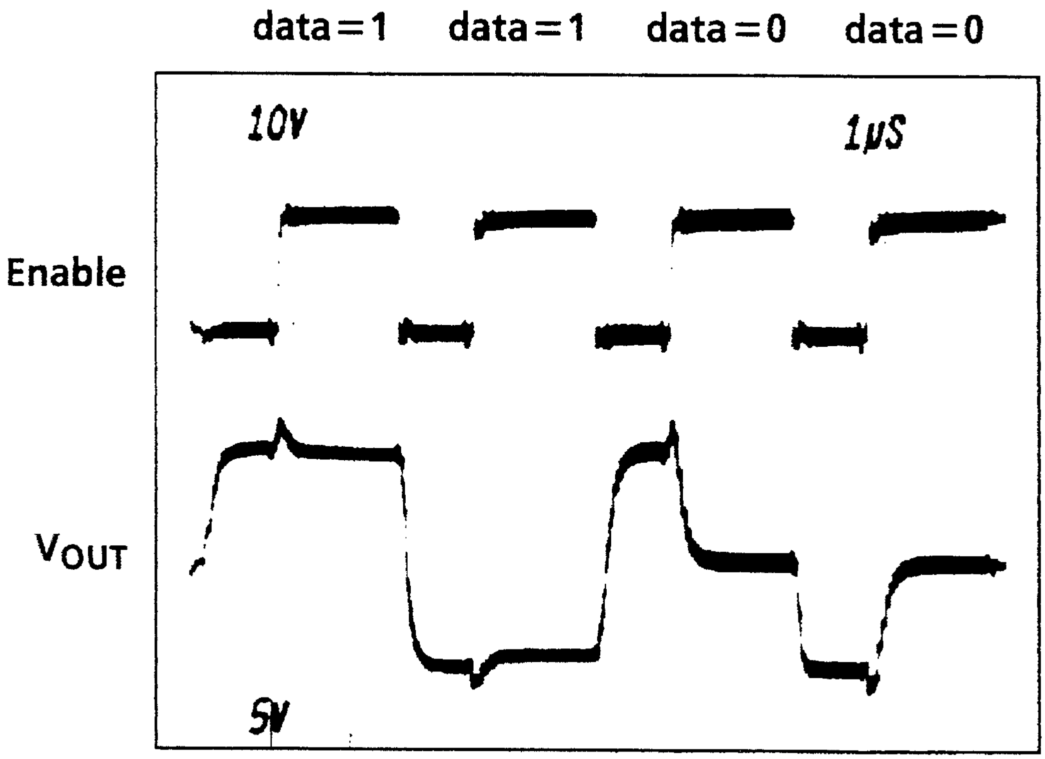
FIG. 15 is a screen image showing voltage waveforms measured at an output of a data driver chip that includes the buffer circuit of FIG. 13.

FIG. 8 shows an AMLCD assembly with a driver assembly attached. FIG. 9 shows an example of scan line signal circuitry in the driver assembly of FIG. 8. FIG. 10 shows a polysilicon TFT buffer circuit that forms the output line driver in the circuitry in FIG. 9. FIG. 11 shows rise and fall times for the buffer circuit of FIG. 10. FIG. 12 shows data line signal circuitry in the driver assembly of FIG. 8. FIG. 13 shows polysilicon TFT circuitry in output buffers in FIG. 12. FIG. 14 shows how the buffer circuit in FIG. 13 responds to its input signals. FIG. 15 shows voltage waveforms from an output of a data driver chip. FIG. 16 shows an pattern of color filter parts in a quad-green color mosaic.

Because of the high density of the array described above, display drivers that were commercially available at the time of the initial implementation were not capable of driving the array. Therefore, in order to implement an AMLCD with the array described above, it was necessary to provide appropriate driving circuitry. An array with amorphous silicon TFTs requires external driver integrated circuits (ICs) to deliver the appropriate scan and data signals to the rows and columns. In one working implementation, commercially available single crystal ICs were mounted on custom multichip modules that were in turn mounted on printed circuit boards and wirebonded directly to pads on the glass substrate of the array, driving odd data lines from one side of the array and even lines from the other. In another working implementation, described below, polysilicon ICs were mounted on a printed circuit board and wirebonded directly to the pads, driving all data lines from one side of the array. Further implementations may employ commercially available single crystal TAB mounted drivers bonded to the pads, alone or in combination with polysilicon scan drivers as described below.

In FIG. 8, product 200 includes AMLCD assembly 202 and driver assembly 204. AMLCD assembly 202 includes active matrix sheet 210, cover sheet 212, spacer 214, and liquid crystal material 216 enclosed in a container defined by sheets 210 and 212 and spacer 214. Driver assembly 204 includes printed circuit board (PCB) 220 and, mounted on PCB 220, polysilicon IC chip 222. Polysilicon IC chip 222 is a customized chip with polysilicon TFT circuitry as described below and with pads that are approximately aligned in mirror image positions with pads for scan lines and data lines on active matrix sheet 210, to facilitate wirebonding. As shown, wirebond 224 connects a pad on chip 222 to a pad on sheet 210 with which it is approximately aligned, and wirebond 226 connects circuitry on chip 222 to circuitry on PCB 220.

Active matrix sheet 210 can be implemented as described above for product 190 in FIG. 7. Cover sheet 212 can be implemented similarly, but with circuitry that provides a single continuous transparent electrode opposite the binary control units on active matrix sheet 210; cover sheet 212 includes opaque regions that block light except in areas in which liquid crystal is under control of a transparent electrode on active matrix sheet 210. The transparent electrode is biased at a voltage $V_1$ as illustrated in FIG. 2 by a connection to an external drive voltage.

Spacer 214, liquid crystal material 216, and other components of product 200 that are not shown can be implemented with conventional techniques. For example, an epoxy seal applied at the perimeter of one sheet can be mixed with small glass rods, and the sheet can also be sprayed with small plastic spheres. When sheets 210 and 212 are glued together, the small glass rods and plastic spheres act as spacers. Liquid crystal material 216 can be a twisted nematic liquid crystal chosen for high resistivity, relatively low threshold such as 2.3 V, and low birefringence. Conventional front and back polarizers and a fluorescent lamp backlight with a brightness of 1000 cd/$m^2$ can be used.

Driver assembly 204 is one of three such assemblies, two for providing scan signals on gate lines and one for providing data signals on data lines. As can be seen from array 190 in FIG. 7, the scan driver assemblies are connected to pads on the two shorter sides of array 210, while the data driver assembly is connected to pads on one of the longer sides of array 210. Except as noted below, each of the driver assemblies is similarly constructed.

In driver assembly 204, chip 222 is produced using a high temperature furnace annealing and a quartz substrate, as described in Wu, I-W., Lewis, A. G., Huang, T.-Y., and Chiang, A. , "Performance of Polysilicon TFT Digital Circuits Fabricated witch Various Processing Techniques and Device Architectures," *SID* 90 *Technical Digest*, 1990, pp. 307–310, incorporated herein by reference. The circuitry is fabricated on wafers following conservative, large-area design rules, maintaining a minimum linewidth of 10 μm, including TFT gate length. The circuitry on the printed circuit boards includes opto-isolators and signal level shifters to translate incoming 5 V control signals to 15–18 V signals to drive polysilicon TFT chips.

Scan line signal circuitry 240 in FIG. 9 receives a clock signal (Clock), an in shift signal (In), a first enable signal (En-1), and a second enable signal (En-2). In response, circuitry 240 provides an out shift signal (Out) and signals on scan lines 1–256. Therefore, eight chips with circuitry 240 can provide 2048 scan line signals if connected so that all receive the same Clock, En-1, and En-2 signals and if connected in series so that the Out signal from one chip is the In signal for the next chip in the series. 16 such chips can be used if the scan lines are driven from both ends.

Circuitry 240 includes 128 delay (D) flip-flops 242, 244, through 246, which form a conventional static shift register. Each of flip-flops 242,244, through 246 provides its output to a pair of AND gates 248, one of which is enabled by the En-1 signal, the other by the En-2 signal.

The maximum shift register clock frequency required for a 30 Hz frame rate is just over 30 kHz for 2048 scan lines, which is readily achieved with polysilicon TFT circuits.

Circuitry 240 provides each of its 256 scan line signals to a scan line buffer on the same chip. FIG. 10 shows buffer circuit 260 which has been successfully used as a scan line buffer.

Because each scan line includes a TFT, a cross-over, and a storage capacitor for each of 3072 binary control units, the total capacitive load is about 500 pF. Meanwhile, the line time of 16 μsec for 30 Hz and 2048 scan lines is considerably shorter than the 70 μsec line time typical of a VGA display. Also, the scan pulse amplitude necessary to ensure adequate pixel charging is about 30 V, well above the drain breakdown voltage for polysilicon TFTs. Therefore, a simple CMOS buffer cannot be used to drive the scan lines—some form of high voltage circuit is required.

Buffer circuit 260 includes stages 262,264, and 266. Stage 266 includes four low voltage transistors arranged in a cascode-like structure such that the gate-source and drain-source voltage appearing across any individual transistor is about half the high voltage supply $V_{HH}$, which is nominally twice as great as $V_{DD}$, which is 15 V. The transistors have the width/length ratios indicated. Therefore, buffer circuit 260 can achieve a 30 V swing in its output signal (Out) in response to an input signal (In) from one of AND gates 248 while limiting the voltage across any individual TFT to about 15 V. High voltage operation is achieved without special structures such as offset drains, and does not complicate the fabrication process. If the scan drivers are implemented using single crystal integrated circuits, a conventional high voltage output stage may be used.

FIG. 11 shows rise and fall times measured for buffer circuit 260 as a function of load capacitance. Transition times of a few microseconds are achieved even for loads of several hundred picofarads, and the rise and fall times remain well matched over a wide range of load capacitance.

For the data drivers, about 200 Mbits/sec of bandwidth is required to operate the display at a 30 Hz frame rate. At the same time, the output buffers must be capable of driving the capacitive load on the data lines.

Data line signal circuitry 280 in FIG. 12 receives a 16 bit wide input data signal (Data in), a first phase signal (Φ-A), a second phase signal (Φ-B), a latch signal (latch), a buffer enable signal (Enable), a first precharge signal (nF1), and a second precharge signal (F2). In response to Φ-A, sixteen first phase data shift registers 282 through 284 load sixteen bits of data at their inputs, while sixteen second phase data shift registers 286 through 288 provide sixteen bits of data at their outputs. In response to Φ-B, second phase shift registers 286 through 288 load sixteen bits of data at their inputs, while first phase shift registers 282 through 284 provide sixteen bits of data at their outputs. Signals Φ-A and Φ-B can each be provided at clock rates up to 10 MHz, so that the sixteen data shift registers together can handle input data at the rate of 320 Mbits/sec.

Once the data shift registers 282 through 284 and 286 through 288 are loaded, the data they store can be provided in parallel to inverting latches 290, which respond to the latch signal by storing all 256 bits of data. Inverting latches 290 then provide the inverted data to 256 output buffers 292, which can be implemented as shown in FIG. 13.

Buffer circuit 300 in FIG. 13 receives Enable, nF1, and F2 signals as described above, in addition to its single bit of data from inverting latches 290 (nData). FIG. 14 illustrates how buffer circuit 300 responds to these signals.

While the Enable signal is LOW during the first part of each cycle, either the nF1 signal enables transistor 302 to pull the output signal (Out) to the high on-state liquid crystal drive voltage $V_{HIGH}$ or the F2 signal enables transistor 304 to pull Out to the low on-state liquid crystal drive voltage $V_{LOW}$.

Then, when the Enable signal goes HIGH during the second part of each cycle, Out remains at $V_{HIGH}$ or $V_{LOW}$ if nData has the value 1, but discharges to a common off-state voltage $V_{MID}$ if nData is 0. This occurs because inverting AND gate 306 provides a LOW signal to inverter 308 and to transistor 310 if nData is $_1$, so that both of back-to-back transistors 310 and 312 remain non-conductive; if nData is 0, however, AND gate 306 provides a HIGH, and both transistors 310 and 312 become conductive, so that $V_{MID}$ is provided as the Out signal.

The second part of each cycle in FIG. 14, during which Enable is HIGH, is sufficiently long to ensure correct charging of each binary control unit's storage capacitor. FIG. 15 shows voltage waveforms measured at the 220th output of a data driver chip. Signals Φ-A and Φ-B were provided at interleaved clock rates of 10 MHz, and the effective line time, i.e. the period of the Enable, nF1, and F2 pulses, was reduced to about 2.5 μsec for convenience. The Out signal drove a load of 250 pF.

Since circuitry 280 can provide 256 bits of data in parallel, twelve chips with such circuits are necessary to provide scan lines of 3072 bits. The clock rates of signals Φ-A and Φ-B described above are high enough, however, that the data for each data driver chip can be loaded sequentially in a single line time with a 30 Hz frame rate, eliminating the need for split panel operation and the associated data reordering. The data driver chips can be loaded sequentially, with all connected to a common data input bus and each chip being enabled in turn by signals from circuitry as described in copending, coassigned U.S. patent application Ser. No. 08/233,190, entitled "Universal Display That Presents All Image Types With High Image Fidelity," incorporated herein by reference. The latch signals can be staggered, however, with the first six chips latched one clock cycle ahead of the second six chips so that the input data stream is continuous and does not need to be interrupted while data is transferred to the latches.

Scan drive and data driver chips as described above are produced with output pads laid out to match the pads on sheet 210. Electrical connection can then be readily achieved by automated wirebonding.

A monochrome display produced as described above has been successfully driven with data defining 6.3 million pixels of an image. Although the display includes binary control units, so that each causes presentation of a segment that is either at maximum or minimum intensity, the density of the binary control units is sufficiently high that shades of gray can be provided by spatial dithering techniques, as described in detail in copending, coassigned U.S. patent application Ser. No. 08/235,015, entitled "Universal Display That Presents All Image Types With High Image Fidelity," incorporated herein by reference. The monochrome display can operate with lower backlight power due to the absence of a color filter and optical efficiency of 7%. In addition, the cost of the monochrome cover sheet is much lower, reducing overall display cost.

A color display can similarly be produced as described above, except that cover sheet 212 includes a color filter patterned on its substrate, covered by a passivation layer of clear polyimide and a patterned ITO electrode. FIG. 16 shows quad-green 2×2 pattern 320 of color filter parts that has been successfully used to produce full color images. In pattern 320, two diagonally opposite parts are both green, while the other two parts are red and blue. A color filter that is a mosaic of parts with pattern 320 thus provides two green segments for each red or blue segment of an image being presented, so that the green phosphor in the backlight can be reduced, improving the color saturation of red and blue and expanding the color gamut: In each instance of pattern 320, zero, one, or two green parts can be at maximum intensity, so that pattern 320 is able to present twelve colors rather than the eight that would be available from an RGB pattern. At the same time, the color display requires a higher power backlight, like that of a conventional RGB color display, to achieve the same brightness as the monochrome display because the color filters absorb some light.

Because pattern 320 covers four binary control units, a color display as described above can be driven with data defining 1.6 million pixels of a color image. Although the display includes binary control units, so that each causes presentation of a segment that is either at maximum or minimum intensity, the density of the binary control units is sufficiently high that a full gamut of colors can be provided by spatial dithering techniques, as described in detail in copending, coassigned U.S. patent application Ser. No. 08/235,015, entitled "Universal Display That Presents All Image Types With High Image Fidelity," incorporated herein by reference.

Demonstrations of the monochrome and color displays described above to industry representatives have evoked expressions of surprise at the image quality obtained.

One apparent source of image quality is the uniformity obtained by using binary control units rather than multi-level light control units such as gray scale units. A display with binary control units provides excellent viewing angle, because the binary control units are either driven fully on or fully off. Each part of the liquid crystal cell therefore operates in a part of its transfer curve in which variations in voltage produce only minimal variations in light transmission. In addition, the relative cell transmission at each end of a scan line is the same, a result very difficult to achieve in a gray scale display due to gate delay and other sources. Experimental results indicate that uniform brightness can be obtained with binary control units even with line resistances up to 70 KOhms, so that non-shunted gate lines can be used even for short line times.

The binary control units also provide cost and efficiency advantages. The drivers for a binary display are less expensive than gray scale drivers, and other circuitry can be simplified. For example, a very narrow TFT and a small storage capacitor can be used to obtain higher yield and larger aperture ratio and a non-self-aligned island can be used for high light immunity. A display with binary control units has lower data bandwidth, simplifying the data interface to the display. Binary control units eliminate the need to correct variations in liquid crystal cell characteristics due to temperature, because the liquid crystal can be driven well into saturation.

The high quality of images presented by the monochrome display also results from its high resolution as well as its brightness. High quality images have been demonstrated with dithered gray scale and with graphics that include single pixel wide lines. The monochrome display can accurately simulate an image that might be produced by a given printer and can show very detailed maps. The monochrome display can present text images with very small fonts, and can display a large amount of readable text at once. The monochrome display can display binary features, gray scale, and full color all in a single image.

The high quality of images presented by the color display benefits from the square shape of the mosaic pattern, as shown in FIG. 16. The green-quad mosaic gives especially good image quality for line graphics and also renders natural scenes very well.

C.4. Variations

The implementations described above could be changed in many ways within the scope of the invention.

The above implementations include an array of binary control units with a diagonal of 33 cm and an area of approximately 510 $cm^2$, with square binary control units 90 μm on a side, with 2048×3072 binary control units in the array, and hence with densities of approximately 111/cm. The invention could be implemented with a wide variety of array sizes and shapes, binary control unit sizes and shapes, and binary control unit densities. For example, densities of 60/cm, 80/cm, and 100/cm could be appropriate. The invention could be implemented, for example, with much larger numbers of binary control units, such as 16 or 21 million.

The above implementations include a monochrome display without a color filter and a color display with a quad-green mosaic color filter, but a monochrome color filter could be used to obtain a monochrome display with any desired hue and a mosaic pat;tern other than quad-green could be used to obtain a color display.

The above implementations include application in a light transmissive AMLCD. The invention could also be implemented in light reflective displays and in displays other than AMLCDs. In addition, the invention could be implemented in other applications, as described below.

The above implementations use a glass substrate, but the invention could be implemented with another appropriate insulating substrate.

The above implementations use particular materials in a thin-film structure, but other materials could be used. For example, bottom metal lines could be formed as described in any of the following copending, coassigned U.S. Patent Applications, all of which are incorporated herein by reference: Ser. No. 08/255,008, entitled "Thin-Film Structure With Conductive Molybdenum-Chromium Line"; Ser. No. 08/235,010, entitled "Thin-Film Structure With Tapered Feature"; Ser. No. 08/234,884, entitled "Dual Dielectric Capping Layers for Hillock Suppression in Metal Layers in Thin Film Structures"; and Ser. No. 08/234,897, entitled "Hillock-Free Multilayer Metal Lines for High Performance Thin Film Structures." In addition, the array could be implemented with polysilicon TFTs rather than amorphous silicon TFTs, making appropriate changes in storage capacitor structure and possibly integrating some of the drive circuitry with the array by forming it around the periphery when the array is fabricated. Or TFTs could be built with different material in the active layer, such as CdSe or SiGe.

The above implementations use particular processes to produce a thin-film structure, but other processes could be used. In some cases, for example, acts could be performed in a different order or with different dopants. In addition, rather than a non-self-aligned TFT, as shown in FIG. 3, a self-aligned TFT could be formed, such as by using backside exposure techniques.

The above implementation uses a specific layout for each binary control unit in an array, but other layouts could be used. For example, rather than a single gate line for each row of pixels, two lines could be provided, a gate line and a grounding line for the common storage capacitor electrode.

The above implementations use particular components, including TFTs, storage capacitors, and so forth, but the invention could be implemented with a wide variety of such components. A switching element other than a TFT could be used in each binary control unit, such as a diode or an MIM structure.

The above implementations produce a thin-film structure that includes an array of binary control units and pads for connecting to driver circuitry. The invention could be implemented with additional circuitry on the substrate. For example, the driver circuitry could be built in laser recrystallized material on the same substrate, such as by producing a hybrid display using amorphous silicon TFTs in the binary control units and polysilicon TFTs in peripheral drive circuits on the same substrate. Laser recrystallization might produce polysilicon TFTs with much better performance than the high temperature furnace recrystallized polysilicon TFTs described above, as described in copending, coassigned U.S. patent application Ser. No. 08/096,313, entitled "Multiple Dielectric Thin Film Transistors," incorporated herein by reference.

D. Other Applications

The invention could be applied in many ways, including computer displays, televisions, copiers, and other machines that present images. The invention is especially appropriate for applications in which high image resolution is required, such as map displays or readers or document readers. In addition, even though the invention provides an array large enough for direct viewing, the array could be used in a projection application, such as for a large size display.

Copending, coassigned U.S. patent application Ser. No. 08/235,015, entitled "Universal Display That Presents All Image Types With High Image Fidelity," incorporated herein by reference, describes techniques for presenting high quality images that can apply the invention.

Copending, coassigned U.S. patent application Ser. No. 08/235,017, entitled "Presenting an Image on a Display as It Would Be Presented by Another Image Output Device or on Printing Circuitry," incorporated herein by reference, describes techniques for previewing a document that can apply the invention.

Copending, coassigned U.S. patent application Ser. No. 08/234,896, entitled "Digital Printer Using Two-Dimensional, Full Frame Light Valve," incorporated herein by reference, describes techniques for printing that can apply the invention.

Copending, coassigned U.S. patent application Ser. No. 08/234,098, entitled "Digital Imaging System Using Two-Dimensional Input Sensor Array and Output Light Valve," incorporated herein by reference, describes techniques for copying that can apply the invention.

E. Miscellaneous Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A product comprising:

a substrate that has a surface; and a thin-film structure formed at the surface of the substrate; the thin-film structure comprising:

an array of binary control units for causing presentation of images; each binary control unit having a lead for receiving a unit drive signal; each binary control unit responding to its unit drive signal by causing presentation of a segment of images presented by the array; each binary control unit being able to present a segment with either of first and second colors, each binary control unit's first color having a maximum intensity the binary control unit can provide, each binary control unit's second color having a minimum intensity the binary control unit can provide; each binary control unit's unit drive signal causing the binary control unit to present its first and second colors;

the array extending in first and second directions that are perpendicular; the binary control units in the array having densities in the first and second directions that are both greater than 60/cm; the array having an area large enough to present images for direct viewing.

2. The product of claim 1 in which the binary control units have densities in the first and second directions that are both greater than 80/cm.

3. The product of claim 2 in which the binary control units have densities in the first and second directions that are both greater than 100/cm.

4. The product of claim 1 in which the binary control units have the same density in both the first direction and the second direction.

5. The product of claim 4 in which the binary control units have a density in both the first and second directions of approximately 111/cm.

6. The product of claim 1 in which the array has a diagonal dimension of approximately 33 cm and an area of approximately 510 $cm^2$.

7. The product of claim 1 in which the array has 3072 binary control units in the first direction and 2048 binary control units in the second direction.

8. The product of claim 1 in which the effective widths of binary control units in the first and second directions are equal.

9. The product of claim 8 in which the effective widths of binary control units in the first and second directions are approximately 90 μm.

10. The product of claim 1, further comprising a liquid crystal cell; the array of binary control units being positioned adjacent the liquid crystal cell with each binary control unit in the array adjacent a part of the liquid crystal cell; each binary control unit responding to its unit drive signal by controlling a light transmission characteristic of the adjacent part of the liquid crystal cell; each binary control unit controlling the light transmission characteristic to have a first value when the binary control unit is presenting its first color and to have a second value when the binary control unit is presenting its second color.

11. The product of claim 10 in which the product is a monochrome display; the binary control units all having the same first color and the same second color.

12. The product of claim 10 in which the product is a color display; the product further comprising a color filter; the color filter having a part for each binary control unit so that the first color of each of a first set of the binary control units is a first non-gray color, the first color of each of a second set of the binary control units is a second non-gray color, and the first color of each of a third set of the binary control units is a third non-gray color; the first, second, and third non-gray colors being different so that the color display can present more than three different non-gray colors.

13. The product of claim 12 in which the color filter includes square groups of four parts, each square group being for first, second, third, and fourth binary control units, the first binary control unit's first color being red, the second binary control unit's first color being green, the third binary control unit's first color being blue, and the fourth binary control unit's first color being green; the second and fourth binary control units being in diagonally opposite corners of a square of binary control units.

14. The product of claim 10 in which the product is an active matrix liquid crystal display.

15. The product of claim 10 in which the light transmission characteristic's first value permits maximum light transmission and the light transmission characteristic's second value permits minimum light transmission.

16. The product of claim 1 in which each binary control unit's unit drive signal can be provided at either of first or second levels; the binary control unit responding to the first level by presenting its first color and responding to the second level by presenting its second color.

17. The product of claim 1 in which each binary control unit comprises:

a capacitive element having a charging lead;

a thin-film transistor having first and second channel leads and a gate lead;

a charging line connecting the second channel lead of the thin-film transistor to the charging lead of the capacitive element;

a signal line for connecting the first channel lead to receive the binary control unit's unit drive signal; and a gate line for connecting the gate lead to receive a scan signal selecting the binary control unit.

18. The product of claim 17 in which the array further comprises scan lines extending in the first direction and data lines extending in the second direction; each scan line connecting to the gate lines of a row of the binary control units; each data line connecting to the signal lines of a column of the binary control units; each scan line including a scan pad along a first edge of the array; each data line including a data pad along a second edge of the array; the product further comprising:

polysilicon thin-film transistor circuitry connected to the scan pads for providing the scan signals on the scan lines; and polysilicon thin-film transistor circuitry connected to the data pads for providing the unit drive signals on the data lines.

19. The product of claim 18 in which the polysilicon thin-film transistor circuitry comprises pads approximately aligned with the scan pads and the data pads.

* * * * *